(12) United States Patent
Chen et al.

(10) Patent No.: US 10,574,259 B2
(45) Date of Patent: Feb. 25, 2020

(54) CONTINUOUS-TIME SENSING APPARATUS

(71) Applicant: InvenSense, Inc., San Jose, CA (US)

(72) Inventors: Du Chen, Saratoga, CA (US); Vadim Tsinker, Belmont, CA (US); Stanley Bo-Ting Wang, Cupertino, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 15/723,814

(22) Filed: Oct. 3, 2017

(65) Prior Publication Data

US 2019/0103880 A1    Apr. 4, 2019

(51) Int. Cl.
| | | |
|---|---|---|
| *H03M 5/02* | (2006.01) | |
| *H03K 17/96* | (2006.01) | |
| *G06F 3/044* | (2006.01) | |
| *H03M 11/10* | (2006.01) | |
| *H03M 11/02* | (2006.01) | |

(52) U.S. Cl.
CPC ............ *H03M 5/02* (2013.01); *H03K 17/962* (2013.01); *B81B 2201/02* (2013.01); *B81B 2201/0221* (2013.01); *B81B 2201/0264* (2013.01); *G06F 3/044* (2013.01); *H03K 17/9622* (2013.01); *H03K 17/9625* (2013.01); *H03M 11/02* (2013.01); *H03M 11/10* (2013.01)

(58) Field of Classification Search
CPC ........ H03M 5/02; H03M 11/02; H03M 11/10; G01P 15/125; B81B 2201/0235; B81B 2201/02; B81B 2201/0221; B81B 2201/0264; G06F 3/02; G06F 3/0202; G06F 3/044; G06F 3/041662; H03K 17/962; H03K 17/9622; H03K 17/9625
See application file for complete search history.

(56) References Cited

U.S. PATENT DOCUMENTS

| | | | | |
|---|---|---|---|---|
| 5,570,136 | A * | 10/1996 | Kim ..................... | H04N 5/4446 348/725 |
| 6,154,027 | A * | 11/2000 | Alexander ............. | G01R 33/07 323/368 |
| 6,970,738 | B1 * | 11/2005 | Othman ................. | A61B 5/053 600/547 |
| 7,293,460 | B2 * | 11/2007 | Zarabadi ............... | G01P 15/125 73/514.32 |
| 8,094,128 | B2 * | 1/2012 | Vu ....................... | G06F 3/03545 345/173 |
| 8,981,833 | B2 * | 3/2015 | Lemkin ................. | G05F 3/24 323/315 |
| 9,074,872 | B2 * | 7/2015 | Kerhuel ................ | F41G 7/20 |
| 9,410,981 | B2 * | 8/2016 | Zhang ................... | G01P 15/125 |
| 2011/0301487 | A1 * | 12/2011 | Abeyratne ............. | A61B 5/048 600/544 |

(Continued)

*Primary Examiner* — Franklin D Balseca

(57) ABSTRACT

A system includes a sensor device, a circuit driving he sensor device at a drive frequency, a receiver, and a low pass filter. The sensor device is configured to change its electrical characteristics in response to external stimuli. The sensor device generates a modulated signal proportional to the external stimuli. The receiver is configured to receive the modulated signal and further configured to demodulate the modulated signal to generate a demodulated signal. The demodulation signal has a guard band. The receiver consumes power responsive to receiving the modulated signal. The low pass filter is configured to receive the demodulated signal and further configured to generate a sensor output.

24 Claims, 6 Drawing Sheets

(56) References Cited

U.S. PATENT DOCUMENTS

| | | | |
|---|---|---|---|
| 2014/0169252 A1* | 6/2014 | Banerjee | H04W 52/0254 |
| | | | 370/311 |
| 2017/0038247 A1* | 2/2017 | Zusman | G01K 1/024 |
| 2017/0150902 A1* | 6/2017 | Gay | A61B 5/0816 |
| 2017/0212635 A1* | 7/2017 | Cordeiro | G06F 3/0418 |
| 2018/0080954 A1* | 3/2018 | Ono | G01P 15/125 |
| 2018/0159473 A1* | 6/2018 | Nestler | H03D 1/22 |

* cited by examiner

CONTINUOUS-TIME SENSING APPARATUS

BACKGROUND

Many electronic devices generate electrical charges that may subsequently be converted into a voltage and sampled to generate a digitized signal. Unfortunately, to convert electrical charges to a voltage requires a settling period to manage the signal integrity and noise. For example, many traditional sensors such as micro-electromechanical system (MEMS) accelerometer devices utilize a sensing scheme that transfer the generated sensing electrical charges in a predefined period and converts it to a voltage which is subsequently sampled and digitized. Unfortunately, the settling requirement of the generated sensing electrical charges to voltage conversion is not only power intensive but also noisy, e.g., when a front end amplifier is used.

SUMMARY

Accordingly, a need has arisen to obtain a digitized signal resulting from the sensing electrical charges generated by the electronic device, e.g., a sensor, a micro-electromechanical system (MEMS) accelerometer device, etc., while reducing the power requirement of the electronic device. In some embodiments, instead of using a sample and hold prior to the analog to digital converter (ADC), the sensed electrical charges are continuously modulated and the modulated signal is subsequently modulated before transmitting it to the ADC. A lower carrier frequency signal, e.g., drive frequency of the sensor, can be used for modulation, therefore reducing power consumption by the electronic device, e.g., a sensor, a micro-electromechanical system (MEMS) accelerometer device, etc., while the ADC uses a different frequency. Furthermore, since no sample and hold methodology is used, the noise folding penalty associated with electronic components such as an amplifier that are used in the electronic device is eliminated. In some embodiments, the modulation signal and the demodulation signal may be different to address temperature variation and to improve performance.

According to some embodiments, an apparatus includes a sensor device, a circuit driving the sensor device at a drive frequency, a receiver, and a low pass filter. The sensor device may be a micro-electromechanical system (MEMS) device. The sensor device is configured to change its electrical characteristics in response to external stimuli. The sensor device generates a modulated signal proportional to the external stimuli. The receiver is configured to receive the modulated signal and further configured to demodulate the modulated signal to generate a demodulated signal. The demodulation signal has a guard band. The receiver consumes power responsive to receiving the modulated signal. The low pass filter is configured to receive the demodulated signal and further configured to generate a sensor output.

In some embodiments, the apparatus may include an analog to digital converter configured to receive the demodulated signal. The analog to digital converter is further configured to generate a digital signal output. The drive frequency is decoupled from a frequency associated with the analog to digital converter. The drive frequency may be lower than the frequency associated with the analog to digital converter. A modulation signal used to generate the modulated signal has a waveform that is different from a waveform of a demodulation signal used by the receiver. The receiver comprises a differential circuit including commutation and blocking switches. The switches are controlled by a demodulation signal waveform used to demodulate the modulated signal.

It is appreciated that the charges on a capacitance of the sensor device changes in response to the external stimuli, e.g., when the sensor is a capacitive sensor. It is appreciated that a resistance of the sensor device varies in response to the external stimuli, e.g., when the sensor is a piezo sensor.

The receiver may include an amplifier coupled to an output of the sensor device. A capacitor may be in parallel to a resistor that are coupled to an input of the amplifier from an output of the amplifier. The resistor biases the input of the amplifier and the output of the amplifier is the modulated signal voltage. It is appreciated that the resistor may be a switched-cap resistor.

These and other features and aspects of the concepts described herein may be better understood with reference to the following drawings, description, and appended claims.

DETAILED DESCRIPTION

Figure 1A:
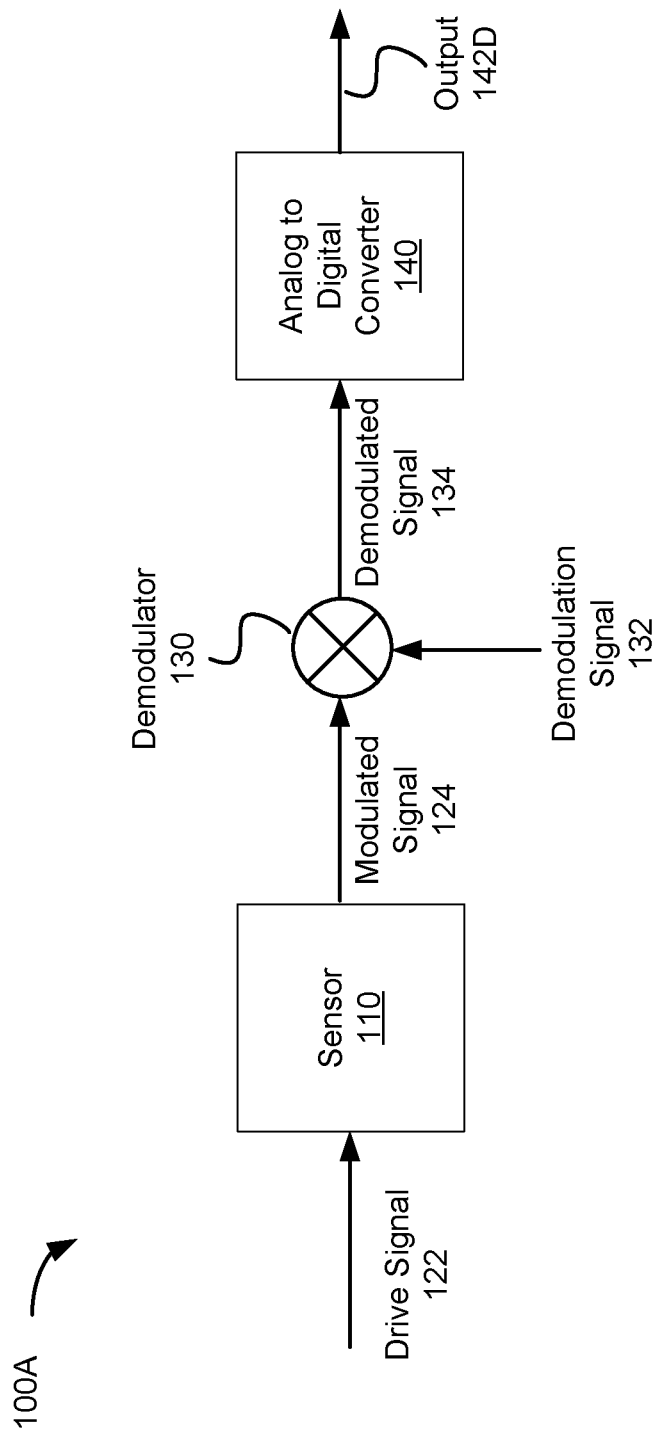
FIGS. 1A-1B show an apparatus with continuous time operation in accordance with some embodiments.

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

A need has arisen to obtain a digitized signal resulting from the sensing electrical charges generated by the electronic device, e.g., a sensor, a micro-electromechanical system (MEMS) accelerometer device, etc., while reducing the power requirement of the electronic device and further while reducing noise. In some embodiments, instead of using a sample and hold prior to the analog to digital converter (ADC), the sensed electrical charges are continuously modulated and the modulated signal is subsequently demodulated before transmitting it to the ADC. A lower carrier frequency signal, e.g., drive frequency of the sensor, can be used for modulation, therefore reducing power consumption by the electronic device, e.g., a sensor, a micro-electromechanical system (MEMS) accelerometer device, etc., while the ADC uses a different frequency. Furthermore, since no sample and hold methodology is used, the noise folding penalty associated with electronic components such as an amplifier that are used in the electronic device is eliminated. In some embodiments, the modulation signal and the demodulation signal may be different to address temperature variation and to improve performance.

Referring now to FIG. 1A, an apparatus with continuous time operation in accordance with some embodiments is shown. The apparatus 100A includes a sensor 110, a demodulator 130, and an analog to digital converter (ADC) 140.

It is appreciated that the sensor 110 may be a microelectromechanical system (MEMS) device such as an accelerometer, a gyroscope, etc. The sensor 110 may change electrical characteristics, e.g., generate charges, change its resistance, etc., in response to an external stimuli, e.g., force. For example, a piezo sensor may change its resistance responsive to the external stimuli whereas a capacitive sensing may generate electrical charges in response to detecting the sensor 110 moving, e.g., acceleration, deceleration, rotation, altitude changes, etc. For example, the sensor 110 may include sensing capacitors (not shown here) that change their electrical charges when the sensor 110 detects movement such as acceleration. The generated signal by the sensor 110 may be referred to as the sensed signal. The sensor 110 may be driven by a drive signal 122, e.g., via a drive circuitry (not shown). The sensed signal may be modulated with a modulation signal. In other words, the electrical charges induced by the sensor 110 are modulated. The modulation signal that modulates the sensed signal may be an amplitude modulated (AM) signal. In other words, the sensed electrical charges are continuously modulated using a modulation signal. As such, a modulated signal 124 is generated. In some embodiments, the modulated signal 124 is proportional to the external stimuli.

The modulated signal 124 is transmitted to a receiver component, e.g., the demodulator 130 for demodulation. In some embodiments, the modulated signal 124 is demodulated by the demodulator 130 using the demodulation signal 132. The demodulation signal 132 may be an amplitude modulated (AM) signal. It is appreciated that in some embodiments, the modulation signal differs from the demodulation signal 132. For example, the waveform of the modulation signal and the demodulation signal 132 may be different, the frequency of the modulation signal and the demodulation signal 132 may be different, the magnitude of the modulation signal and the demodulation signal 132 may be different, etc. As such, the induced electrical charges from the sensor 110 that are continuously modulated to generate the modulated signal 124 are continuously demodulated to generate the demodulated signal 134.

The demodulated signal 134 is then transmitted to the ADC 140 to get digitized and to generate the digital output signal 142. It is appreciated that noise folding penalty is reduced because the apparatus 100 does not utilize a sample and hold before the ADC 140. Furthermore, it is appreciated that the drive frequency of the sensor 110 can be decoupled from the sampling frequency of the ADC 140. As such, lowering the drive frequency of the sensor 110 reduces power consumption by the sensor 110 while it enables the sensor 110 to continuously be operational by modulating the generated electrical charges.

Moreover, the frequency associated with the demodulation signal 132, e.g., carrier frequency, is decoupled from the sampling frequency of the ADC 140, thereby reducing power consumption of the apparatus 100. It is further appreciated that decoupling the drive frequency for the sensor 110 and/or the frequency associated with the demodulation signal 132 from the sampling frequency of the ADC 140 reduces gain variation over temperature and flexibly allows the designer to choose the appropriate ADC 140 with proper sampling frequency without being constrained by the drive frequency and/or carrier frequency. It is appreciated that the carrier frequency of the modulation signal and/or the demodulation signal 132 may be lower than the sampling frequency of the ADC 140 in some embodiments. In some embodiments, the ADC 140 may include an embedded anti-aliasing filter to reduce aliasing in the sampled signal.

According to some embodiments, decoupling of the drive frequency and/or demodulation carrier frequency from the sampling frequency of the ADC 140 enables circuit designers to selectively choose the drive waveform for the sensor 110 and the waveform for demodulation signal 132 in order to address offset issues associated with the sensor 110 that may be a MEMS device. For example, a guard band waveform may be used for the demodulation signal 132 to mitigate temperature variation and other MEMS sensor issues such as limited bandwidth and slewing of front-end. It is appreciated that in some embodiments, the receiver becomes enabled and operational when the modulated signal 124 is received, thereby reducing power consumption.

Figure 1B:
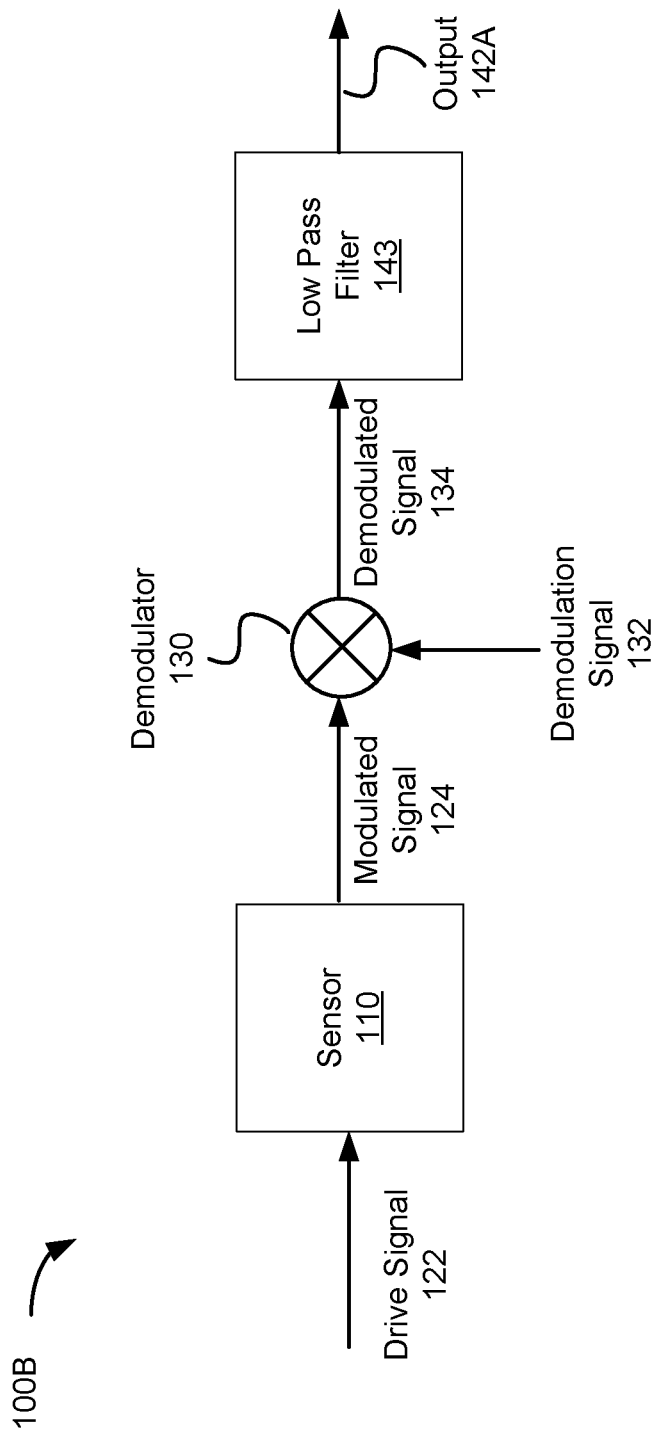

Referring now to FIG. 1B, an apparatus with continuous time operation in accordance with some embodiments is shown. In this embodiment, the demodulated signal 134 is input to the low pass filter 143, which generates that analog output 142 signal from the sensor.

Figure 2:
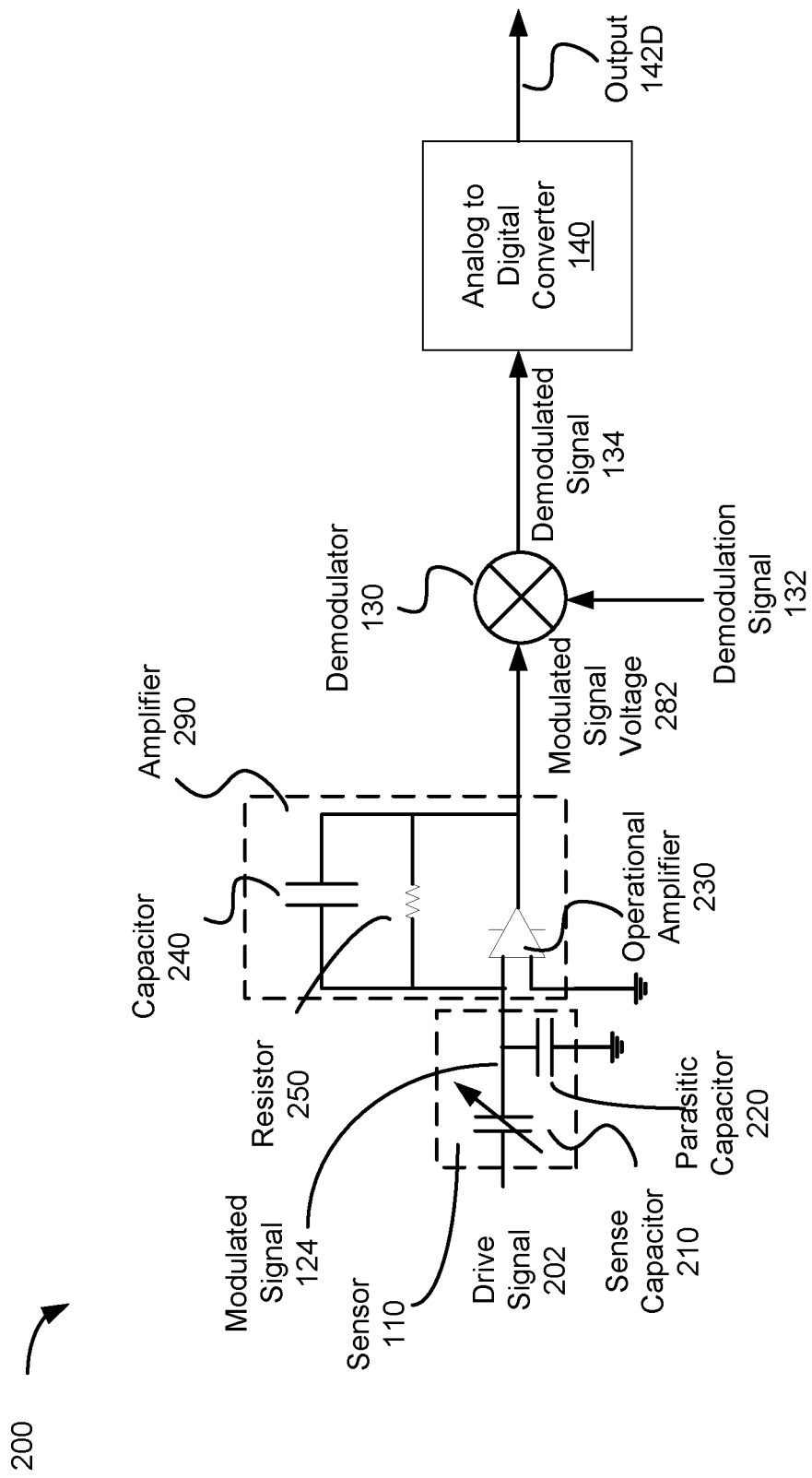
FIG. 2 shows another apparatus with continuous time operation in accordance with some embodiments.

Referring now to FIG. 2, another apparatus 200 with continuous time operation in accordance with some embodiments is shown. Apparatus 200 is similar to that of apparatus 100. Apparatus 200 includes the sensor 110 that includes sense capacitors 210 for generating electrical charges responsive to an external stimulus, e.g., acceleration, deceleration, rotation, altitude changes, etc. It is appreciated that capacitor 210 may be a variable capacitor in some embodiments. The capacitance value of sense capacitor 210 varies responsive to an external stimulus. Parasitic capacitor 220 includes the parasitic capacitance associated with the sensor. The sensor 110 may be driven with a drive signal 202. It is appreciated that in one embodiment, the sense capacitor 210 modulates the sensed signal to generate a modulated signal (similar to the modulated signal 124 in FIG. 1). The modulated signal may be transmitted to a receiver, e.g., the amplifier 290.

Amplifier 290 comprises of the operational amplifier 230, capacitor 240 and resistor 250. The sensor 110 is coupled to the amplifier 290 that converts the sensed charges by the capacitor 210 into a voltage value through the feedback capacitor 240. It is appreciated that the output of the amplifier 290 is coupled through a feedback path, via the feedback capacitor 240 that is in parallel to resistor 250, to the sensor 110 and in some embodiments to the output of capacitors 210 and 220. The capacitor 240 continuously converts the modulated charge signal 124 to a modulated signal voltage 282. The resistor 250 may be a high resistance resistor 250 that biases the input of the amplifier 290. The output of the capacitor 240 that is in parallel with the resistor 250 that is in parallel with the amplifier 290 is the voltage signal for the modulated signal 124, as discussed above. It is appreciated that the operational amplifier 230 and the capacitor 240 may be initialized to their half swing such that the modulated signal 124 is centered at a desired common mode voltage.

It is appreciated that lowering the frequency of the drive signal 202, while maintains the sensor 110 in operating mode, lowers its power consumption. It is also appreciated that the decoupling of the frequency of the drive signal 202 and/or the frequency of the carrier signal for the demodulation signal 132 from the sampling frequency of the ADC 140 provides the flexibility of lowering the frequency for the drive signal 202 to lower power and further to reduce gain variation over temperature. It is further appreciated that the waveform for the drive signal 202 and the demodulation signal 132 may be chosen to mitigate various offset issues associated with the sensor 110 that may be a MEMS device. Furthermore, it is appreciated that the waveform for the drive signal 202 and the demodulation signal 132 may be chosen to mitigate various offset issues associated with the amplifier 290. For example, a guard band signal may be used for the demodulation signal 132. It is appreciated that in some embodiments, the waveform for the drive signal 202 may be the same as the waveform for the demodulation signal 132. However, in alternative embodiments, the waveform for the drive signal 202 is different from the waveform for the demodulation signal 132.

It is appreciated that issues associated with noise folding is reduced or eliminated since no sample and hold (sampling technique) is used in the path between the sensor 110, the amplifier 290, and the demodulator 130 until the ADC 140. Thus, noise and power density of apparatus 200 is improved in comparison to an apparatus that uses a sample and hold sampling technique.

Figure 3:
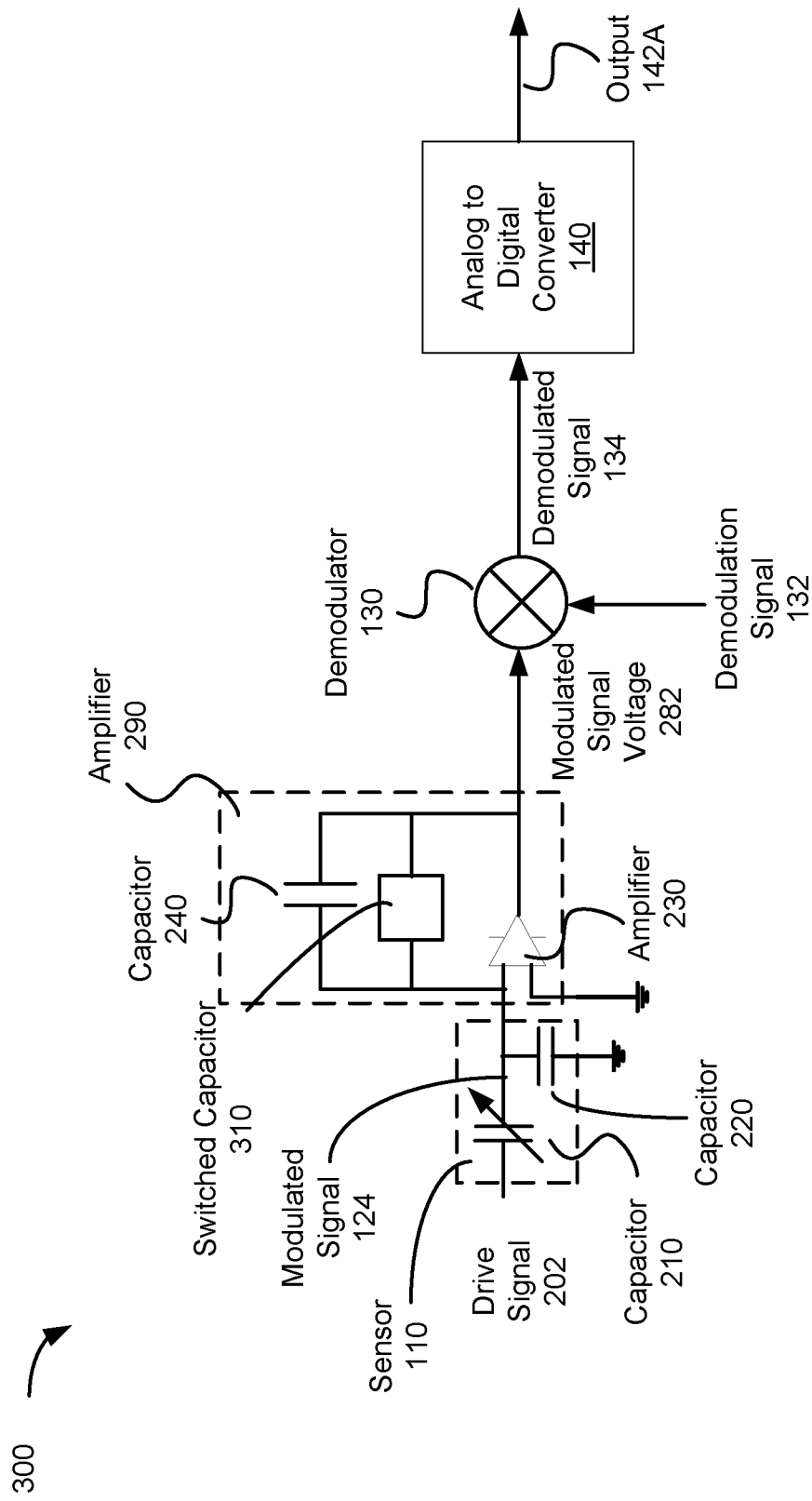
FIG. 3 shows yet another apparatus with continuous time operation in accordance with some embodiments.

Referring now to FIG. 3, yet another apparatus 300 with continuous time operation in accordance with some embodiments is shown. Apparatus 300 is similar to that of apparatus 200. Apparatus 300 includes a switched capacitor 310 resistor instead of resistor 250 of FIG. 2. The switched capacitor 310 resistor biases the input of the operational amplifier 230. It is appreciated that the switched capacitor 310 may be a component within the receiver.

Figure 4:
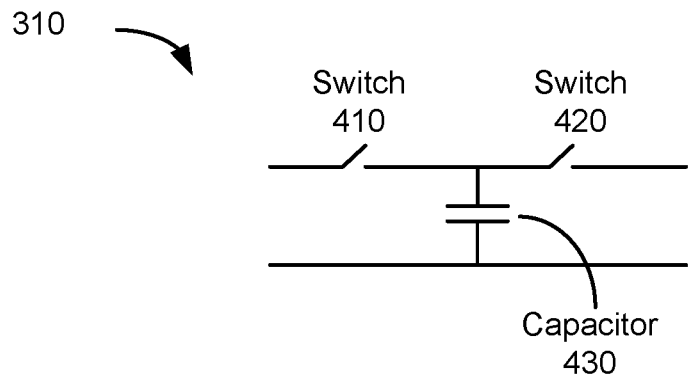
FIG. 4 shows a switched-cap resistor in accordance with some embodiments.

Referring now to FIG. 4, a switched-cap resistor 310 in accordance with some embodiments is shown. The switched-cap resistor 310 may be implemented by using switches 410 and 420, and a capacitor 430. The output of the switch 410 may be coupled to the input of the switch 420 and further coupled to the capacitor 430. The electrical charges move into the capacitor 430 and out of the capacitor 430 in response to the switches 410 and 420 opening and closing.

Figure 5A:
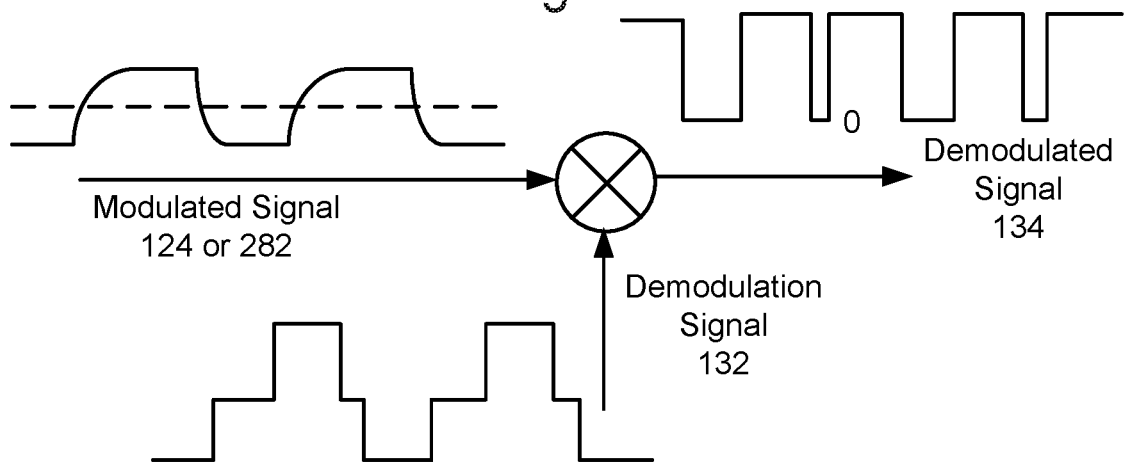
FIGS. 5A-5B show illustrative modulated and demodulated signals in accordance with some embodiments.
Figure 5B:
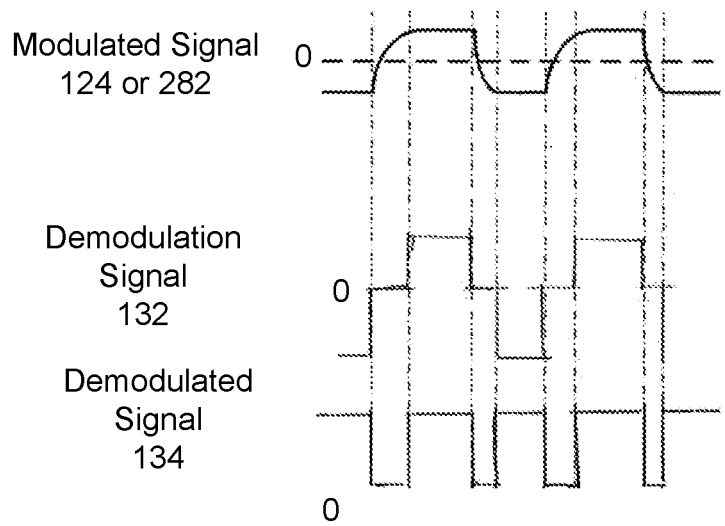

Referring now to FIGS. 5A-5B, illustrative modulated and demodulated signals in accordance with some embodiments are shown. For example, the modulated signal 124 or 282 rising before it becomes steady and then it discharges and becomes steady before it rises again. In other words, the signal may be unsettled during rise, etc. Modulating the signal with a guard band signal generates a null signal during unsettled period, e.g., rise time, etc., and a non-null signal during the settled period. Thus, sampling the signal produces accurate sampling. It is appreciated that in some embodiments the modulated signal 124 or 282 is input to the demodulator 130 and is demodulated with the demodulation signal 132. The demodulation signal 132 may have a particular waveform shape. For example, the demodulation signal 132 may have a guard band period during the transition time that prohibits modulated signal 124 or 282 from passing through the demodulator. Therefore, temperature variation associated with the amplifier 230 and/or the sensor 110 may be mitigated.

Figure 6:
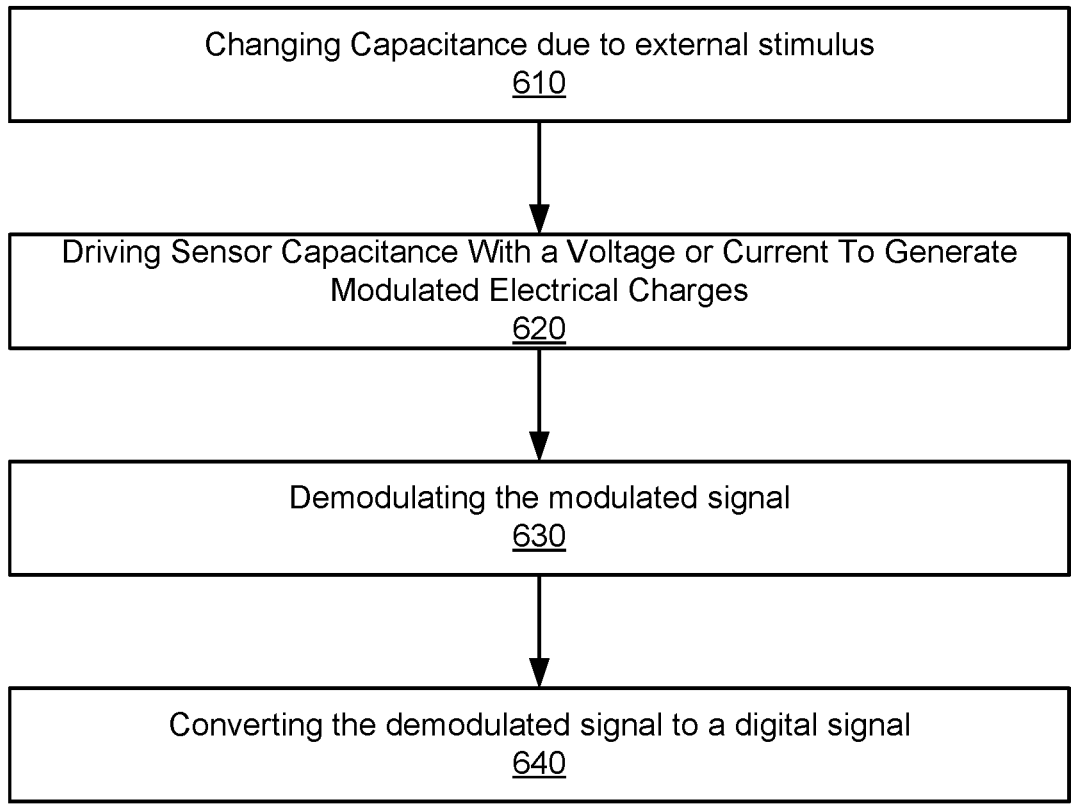
FIG. 6 shows a method of operating a device in continuous time operation in accordance with some embodiments.

Referring now to FIG. 6, a method of operating a device in continuous time operation in accordance with some embodiments is shown. At step 610, in response to an external stimulus such as acceleration, deceleration, altitude change, etc., the capacitance of the sensor may vary. For example, the sensor 110 and the capacitors 210 and 210 may generate capacitance change in response to acceleration. At step 620, a voltage or current signal may drive the sensor and generate modulated electrical charges. For example, the electrical charges may be modulated using the modulation signal 122 and/or the capacitor 210 as discussed above. It is appreciated that steps 610 and 620 may occur simultaneously and as one step. At step 630, the modulated signal is demodulated. For example, the demodulator 130 may use a demodulation signal 132 to demodulate the modulated signal 124. At step 640, the demodulated signal may be converted into a digital signal. For example, the ADC 140 may be used to digitize the demodulated signal 134.

It is appreciated that lowering the frequency of the drive signal 202 of the sensor, while maintaining the sensor 110 in operating mode, lowers its power consumption. It is also appreciated that the decoupling of the frequency of the drive signal 202 and/or the frequency of the carrier signal for the demodulation signal 132 from the sampling frequency of the ADC 140 provides the flexibility of lowering the frequency for the drive signal 202 to lower power and further to reduce gain variation over temperature. It is further appreciated that the waveform for the drive signal 202 and the demodulation signal 132 may be chosen to mitigate various offset issues associated with the sensor 110 that may be a MEMS device. Furthermore, it is appreciated that the waveform for the drive signal 202 and the modulation signal 132 may be chosen to mitigate various offset issues associated with the amplifier 230. For example, a guard band signal may be used for the demodulation signal 132. It is appreciated that in some embodiments, the waveform for the drive signal 202 may be the same as the waveform for the demodulation signal 132. However, in alternative embodiments, the waveform for the drive signal 202 is different from the waveform for the demodulation signal 132.

It is appreciated that issues associated with noise folding is reduced or eliminated since no sample and hold (sampling technique) is used in the path between the sensor 110, the amplifier 230, and the demodulator 130 until the ADC 140. Thus, noise and power density of apparatus 200 is improved in comparison to an apparatus that uses a sample and hold sampling technique.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. An apparatus comprising:
   a sensor device configured to change its electrical characteristics in response to external stimuli;
   a circuit driving the sensor device at a drive frequency, wherein the sensor device uses a modulation signal to generate a modulated signal proportional to the external stimuli;
   a receiver configured to receive the modulated signal and further configured to demodulate the modulated signal to generate a demodulated signal, wherein a demodulation signal is a rectangular wave that has a guard band and is used to demodulate the modulated signal, and wherein the modulation signal is different from the demodulation signal; and
   a low pass filter configured to receive the demodulated signal and further configured to generate a sensor output.

2. The apparatus as described in claim 1 further comprising:
   an analog to digital converter configured to receive the demodulated signal without passing through a sample and hold circuitry, and wherein the analog to digital converter is further configured to generate a digital signal output.

3. The apparatus as described in claim 2, wherein the drive frequency is decoupled from a frequency associated with the analog to digital converter.

4. The apparatus of claim 2, wherein a frequency associated with the demodulation signal is decoupled from a sampling frequency associated with the analog to digital converter.

5. The apparatus as described in claim 1, wherein the modulation signal used to generate the modulated signal has a waveform that is different from a waveform of the demodulation signal used by the receiver.

6. The apparatus as described in claim 1, wherein the receiver comprises a differential circuit including commutation and blocking switches.

7. The apparatus as described in claim 6, wherein the switches are controlled by a demodulation signal waveform used to demodulate the modulated signal.

8. The apparatus as described in claim 1, wherein the sensor device is a micro-electromechanical system (MEMS) device.

9. The apparatus as described in claim 1, wherein charges on a capacitance of the sensor device changes in response to the external stimuli.

10. The apparatus as described in claim 1, wherein a resistance of the sensor device varies in response to the external stimuli.

11. The apparatus as described in claim 9, wherein the receiver comprises an amplifier coupled to an output of the sensor device, and wherein a capacitor is in parallel to a resistor that are coupled to an input of the amplifier from an output of the amplifier, wherein the resistor biases the input of the amplifier, and wherein the output of the amplifier is the modulated signal voltage.

12. The apparatus as described in claim 11, wherein the resistor is a switched-cap resistor.

13. The apparatus of claim 1, wherein a frequency of the modulation signal is different from a frequency of the demodulation signal.

14. An apparatus comprising:
   a sensing capacitor of a sensing device configured to generate electrical charges in response to external stimuli, wherein the sensing device is driven at a drive frequency, and wherein the sensing device uses a modulation signal to generate a modulated signal proportional to the external stimuli;
   an amplifier coupled to the sensing capacitor, wherein the amplifier receives the modulated signal and wherein the amplifier is configured to convert the modulated signal into a voltage signal;
   a demodulator configured to demodulate the voltage signal to generate a demodulated signal, wherein a demodulation signal is a rectangular wave that has a guard band and is used to demodulate the modulated signal, and wherein the modulation signal is different from the demodulation signal, and wherein the amplifier consumes power responsive to receiving the modulated signal; and
   a low pass filter configured to receive the demodulated signal and further configured to generate a sensor output.

15. The apparatus as described in claim 14 further comprising:
   an analog to digital converter configured to receive the demodulated signal and wherein the analog to digital converter is further configured to generate a digital signal output, and wherein the analog to digital converter comprises embedded anti-aliasing filter.

16. The apparatus as described in claim 15, wherein the drive frequency is decoupled from a frequency associated with the analog to digital converter.

17. The apparatus as described in claim 14, wherein the modulation signal used to generate the modulated signal has a waveform that is different from a waveform of a demodulation signal used by the demodulator.

18. The apparatus as described in claim 14, wherein the sensing device is a micro-electromechanical system (MEMS) device.

19. The apparatus as described in claim 14, wherein a capacitor is in parallel to a resistor that are coupled to an input of the amplifier from an output of the amplifier, wherein the resistor biases the input of the amplifier, and wherein the output of the amplifier is the modulated signal voltage.

20. The apparatus as described in claim 19, wherein the resistor is a switched-cap resistor.

21. A method comprising:
   changing a capacitance associated with a sensor responsive to an external stimulus;
   driving the capacitance associated with the sensor;
   generating a modulated electrical signal responsive to the driving;
   demodulating the modulated electrical signal to generate a demodulated signal, wherein a modulation signal used to generate the modulated electrical signal is different from a demodulation signal used to generate the demodulated signal, and wherein the demodulation signal is a rectangular wave that has a guard band; and converting the demodulated signal to a digital signal, wherein a frequency associated with converting the demodulated signal to the digital signal is decoupled from a drive frequency of the sensor device.

22. The method as described in claim 21, wherein no sampling is performed prior to the converting.

23. The method as described in claim 21, wherein a carrier signal associated with the demodulating is a guard-band signal.

24. The method as described in claim 21, wherein the capacitance is driven with a voltage or current.

* * * * *